(12) United States Patent
Fujiwara (10) Patent No.: US 9,972,749 B2
(45) Date of Patent: May 15, 2018

(54) SEMICONDUCTOR LIGHT-EMITTING ELEMENT

(71) Applicant: STANLEY ELECTRIC CO., LTD., Meguro-ku, Tokyo (JP)

(72) Inventor: Takako Fujiwara, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days. days.

(21) Appl. No.: 15/561,032

(22) PCT Filed: Mar. 7, 2016

(86) PCT No.: PCT/JP2016/056940
§ 371 (c)(1),
(2) Date: Sep. 22, 2017

(87) PCT Pub. No.: WO2016/152473
PCT Pub. Date: Sep. 29, 2016

(65) Prior Publication Data
US 2018/0062039 A1 Mar. 1, 2018

(30) Foreign Application Priority Data

Mar. 23, 2015 (JP) ................................. 2015-059988

(51) Int. Cl.
*H01L 33/32* (2010.01)
*H01L 33/24* (2010.01)
(Continued)

(52) U.S. Cl.
CPC .............. *H01L 33/24* (2013.01); *H01L 33/06* (2013.01); *H01L 33/145* (2013.01); *H01L 33/32* (2013.01)

(58) Field of Classification Search
CPC .......... H01L 33/04; H01L 33/24; H01L 33/32
See application file for complete search history.

(56) References Cited

U.S. PATENT DOCUMENTS

| 6,121,634 A | 9/2000 | Saito et al. |
| 2005/0056850 A1* | 3/2005 | Taki ........................ H01L 33/24 257/79 |

(Continued)

FOREIGN PATENT DOCUMENTS

| JP | 10145000 A | 5/1998 |
| JP | 10294532 A | 11/1998 |

(Continued)

OTHER PUBLICATIONS

International Search Report (ISR) and Written Opinion dated Jun. 28, 2016 issued in International Application No. PCT/JP2016/056940.

(Continued)

*Primary Examiner* — Kyoung Lee
*Assistant Examiner* — Christina Sylvia
(74) *Attorney, Agent, or Firm* — Holtz, Holtz & Volek PC (57) ABSTRACT

A semiconductor light-emitting element according to the present invention includes a first semiconductor layer of a first conductivity type, a light-emitting functional layer formed on the first semiconductor layer, and a second semiconductor layer that is formed on the light-emitting functional layer and is of a second conductivity type opposite to that of the first semiconductor layer. The light-emitting functional layer includes a doped layer that is formed on the first semiconductor layer and doped with a dopant of the second conductivity type, a base layer formed on the doped layer, the base layer having such a composition that causes stress and strain in said base layer from the doped layer, said base layer including a plurality of base segments formed in a random net shape, and a quantum well structure layer formed on the base layer.

6 Claims, 5 Drawing Sheets

(51) Int. Cl.
*H01L 33/14* (2010.01)
*H01L 33/06* (2010.01)

(56) References Cited

U.S. PATENT DOCUMENTS

| | | |
|---|---|---|
| 2008/0073657 A1 | 3/2008 | Liang et al. |
| 2009/0206320 A1 | 8/2009 | Chua et al. |
| 2012/0077298 A1 | 3/2012 | Liang et al. |
| 2016/0118539 A1* | 4/2016 | Sugiyama ........... H01L 21/0242 257/13 |

FOREIGN PATENT DOCUMENTS

| | | |
|---|---|---|
| JP | 2008535215 A | 8/2008 |
| JP | 4984119 B2 | 7/2012 |
| WO | 2014181558 A1 | 11/2014 |
| WO | 2016072276 A1 | 5/2016 |

OTHER PUBLICATIONS

Shioda, et al, "A Proposal of InGaN-Based Multiple-Colored Light Emitting Devices Using Selective Area Metal-Organic Vapor Phase Epitaxy," IEICE Technical Report, Electron Devices, Nov. 27, 2008, 108(321), pp. 13-16.

Soh, et al, "Cool white III-nitride light emitting diodes based on phosphor-free indium-rich InGaN nanostuctres," Applied Physics Letters, 92, 2008, pp. 261909-1 to 261909-3.

* cited by examiner

SEMICONDUCTOR LIGHT-EMITTING ELEMENT

TECHNICAL FIELD

The present invention relates to a semiconductor light-emitting element such as a light-emitting diode (LED).

BACKGROUND ART

A semiconductor light-emitting element is usually produced by growing a semiconductor structure layer formed from an n-type semiconductor layer, an active layer, and a p-type semiconductor layer on a growth substrate, and forming an n-electrode and a p-electrode that apply a voltage to the n-type semiconductor layer and the p-type semiconductor layer, respectively.

Japanese Patent No. 4984119 discloses a semiconductor light-emitting element including an active layer that is laminated on a substrate and has a surface including a portion of which an inclination angle with respect to the substrate changes smoothly, and a method for manufacturing the same. Non-Patent Literature 1 discloses a light-emitting diode including an active layer having a multiple quantum well structure in which an InGaN layer is laminated on another InGaN layer that has a high indium composition and a nanostructure.

CITATION LIST

Patent Literature

Patent Literature 1: Japanese Patent No. 4984119

Non-Patent Literature

Non-Patent Literature 1: Applied Physics Letters 92, 261909 (2008)

SUMMARY OF INVENTION

Technical Problem

The semiconductor light-emitting element emits light by combining (recombining) an electron and hole injected into the element from the electrodes in the active layer. The wavelength (i.e., emitted light color) of light emitted from the active layer varies with the band bap of the semiconductor material constituting the active layer. For example, if the light-emitting element uses a nitride-based semiconductor, blue light is emitted from the active layer.

Some light sources, such as one for illumination applications, need high color rendering properties. A light source having high color rendering properties emits light similar to natural light. To obtain high color rendering properties, light having wavelengths across almost the entire visible region is preferably extracted from the light source. For example, light extracted from a light source having high color rending properties is observed as white light.

There have been proposed various techniques for obtaining white light by using a semiconductor light-emitting element. An example is a technique for mixing a wavelength conversion member such as a phosphor into a sealing resin, and sealing the element with the sealing resin to produce a light-emitting device. For example, if a semiconductor light-emitting element uses an active layer that emits blue light, a part of the blue light from the active layer is converted into yellow light by a phosphor, and the blue light and the yellow light are mixed and extracted. White light is then observed as a whole. Like Patent Literature 1 and the like, there have been proposed techniques for forming an uneven pattern by using a processing technique such as etching before the growth of the active layer, and forming the active layer on the inclined surfaces to widen the range of emission wavelengths without using a phosphor.

However, if a light-emitting device is produced by using such techniques, there have been problems in terms of the uniformity of the emission wavelengths within the device, the complication of the manufacturing steps, and light-emitting intensity. Examples include the addition of a mixing step of a phosphor, a secular change of the wavelength conversion efficiency of the phosphor, the addition of a step of processing a semiconductor layer, and degradation of crystallinity due to the processing of the semiconductor layer.

The present invention has been made in view of the foregoing problems, and an object thereof is to provide a semiconductor light-emitting element that eliminates the need for a wavelength conversion member such as a phosphor, has high color rendering properties and high light-emitting intensity with a wide emission wavelength bandwidth (spectral width) across the visible region, and is easily to control the emission wavelength range.

Solution to Problem

The semiconductor light-emitting element according to the present invention includes: a first semiconductor layer of a first conductivity type; a light-emitting functional layer formed on the first semiconductor layer; and a second semiconductor layer that is formed on the light-emitting functional layer and is of a second conductivity type opposite to that of the first semiconductor layer, wherein the light-emitting functional layer includes a doped layer that is formed on the first semiconductor layer and doped with a dopant of the second conductivity type, a base layer formed on the doped layer, the base layer having such a composition that causes stress and strain in said base layer from the doped layer, said base layer including a plurality of base segments formed in a random net shape, and a quantum well structure layer formed on the base layer.

DESCRIPTION OF EMBODIMENTS

Embodiments of the present invention will be described in detail below. In the present specification, the same or equivalent components are designated by the same reference numerals.

First Embodiment

Figure 1A:
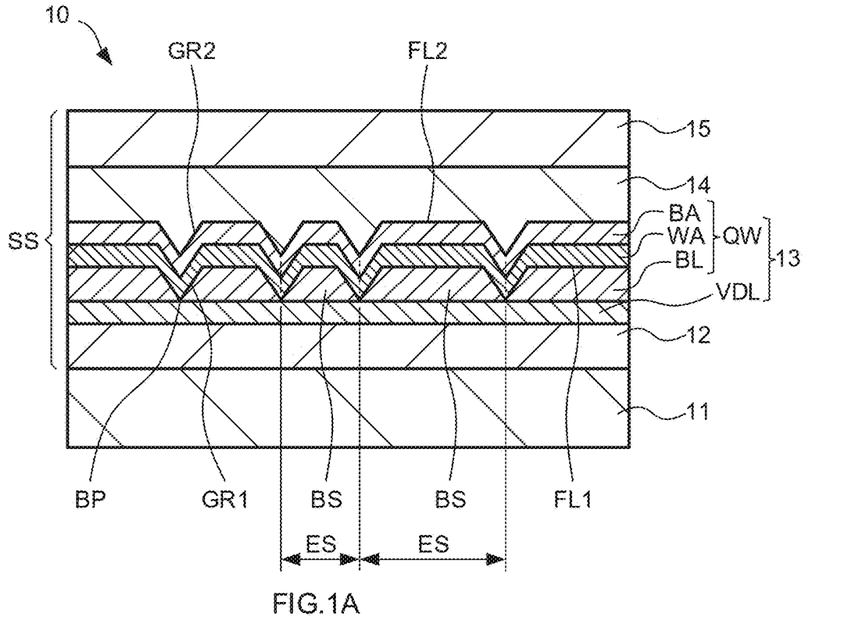
FIG. 1A is a cross-sectional view illustrating a structure of a semiconductor light-emitting element according to a first embodiment.

FIG. 1A is a cross-sectional view illustrating a structure of a semiconductor light-emitting element (hereinafter, may be referred to simply as a light-emitting element or an element) 10 according to a first embodiment. The semiconductor light-emitting element 10 has a structure in which a semiconductor structure layer SS is formed on a mounting substrate (hereinafter, may be referred to simply as a substrate) 11 formed from sapphire. The semiconductor structure layer SS will be concretely described below.

An n-type semiconductor layer 12 serving as a first semiconductor layer is formed from, for example, a GaN layer containing an n-type dopant (for example, Si). A light-emitting functional layer 13 is a layer that is formed on the n-type semiconductor layer 12 and includes a quantum well structure QW. The light-emitting functional layer 13 will be described in detail below.

An electron blocking layer 14 is formed on the light-emitting functional layer 13 and formed from, for example, an AlGaN layer. A p-type semiconductor layer 15 is formed on the electron blocking layer 14 and formed from, for example, a GaN layer containing a p-type dopant (for example, Mg). The n-type semiconductor layer 12 may include a plurality of n-type semiconductor layers having different dopant concentrations. The electron blocking layer 14 may contain a p-type dopant. The p-type semiconductor layer 15 may have a contact layer on its principal surface opposite from the interface with the electron blocking layer 14.

The light-emitting functional layer 13 is described in detail below. The light-emitting functional layer 13 may include a plurality of light-emitting functional layers, whereas the present embodiment deals with a case in which the light-emitting functional layer 13 is formed from one light-emitting functional layer.

A variable doped layer VDL serving as a doped layer is a layer formed on the n-type semiconductor layer 12. The variable doped layer VDL is a layer of GaN doped with a p-type dopant such as Mg. A base layer BL which is an AlN layer doped with Mg, for example, is formed on the variable doped layer VDL. The doping amount of the variable doped layer VDL is adjusted to change a shape and size of the base layer BL formed on the variable doped layer VDL. The doping amount of the variable doped layer VDL is preferably set to $1e^{21}$ atoms/cm$^3$ or less in view of a drop in crystallinity.

The base layer BL has grooves GR1 which are formed in a random net shape under stress from the variable doped layer VDL. The grooves GR1 are formed by connecting a plurality of groove portions generated by strass and strain generated in the base layer BL due to different compositions between the variable doped layer VDL and the base layer BL, and have a mesh-like shape as a whole. The strass and strain generated in the base layer EL occurs because the crystal structure of the base layer BL is strained by differences between the lattice constants of the n-type semiconductor layer 12 and the variable doped layer VDL and that of the base layer BL.

In other words, the strass and strain generated in the base layer BL varies with a change in the doping amount of the variable doped layer VDL with Mg. The greater the doping amount of the variable doped layer VDL with Mg is, the smaller the strass and strain generated in the base layer BL in a compressive direction, i.e., the compressive strain is.

Figure 1B:
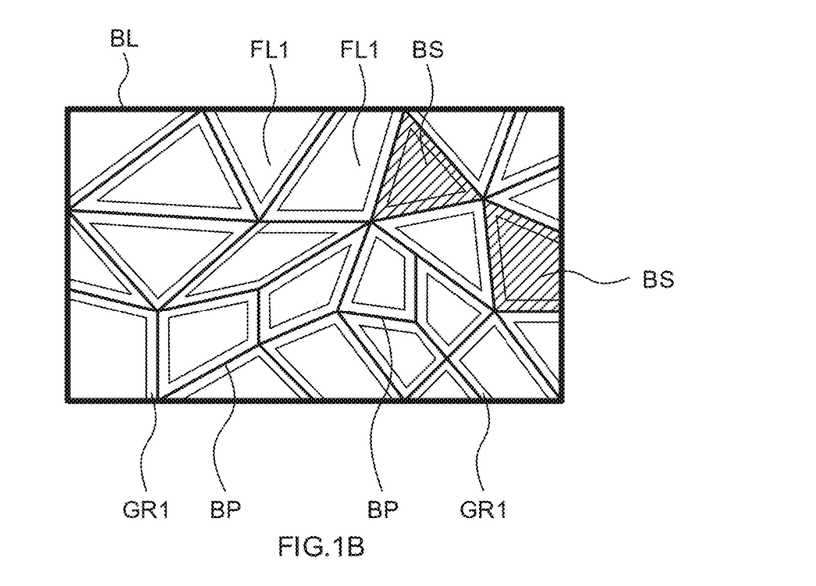
FIG. 1B is a schematic top plan view of a base layer of a light-emitting functional layer.

The base layer BL will now be described with reference to FIG. 1B. FIG. 1B is a diagram schematically showing the top surface of the base layer BL. The base layer BL includes a large number of fine base segments BS which are defined by the first grooves GR1 and formed in random sizes. The base layer is subject to the strass and strain from the n-type semiconductor layer 12 and the variable doped layer VDL, whereby the base segments BS are defined in a random net shape in the base layer BL.

The first grooves GR1 are constituted of groove portions having random, different lengths and shapes. The first grooves GR1 are formed to spread over the surface of the base layer BL in a net shape (mesh shape). Each base segment BS is a portion (segment) defined and formed in the base layer BL at random by the first grooves GR1. The base segments BS have various top shapes such as a substantially circular shape, a substantially elliptical shape, and a polygonal shape.

As illustrated in FIG. 1A, the first grooves GR1 have a V shape, for example, and have a line-shaped bottom portion BP. In this embodiment, the base segments BS each has edge portions at the bottom portions BP of the first grooves GR1. Each base segment BS adjoins other base segments BS at bottom portions BP.

The base layer BL includes flattened portions (hereinafter, referred to as first flattened portions) FL1 corresponding to the respective base segments BS. The surface of the base layer BL is constituted by the first flattened portions FL1 and the side wall surfaces of the first grooves GR1. The first flattened portions FL1 are defined per base segment BS by the first grooves GR1. A base segment BS includes a top surface formed from a first flattened portion FL1 and side surfaces formed from side walls surfaces of the first grooves GR1.

In other words, the first flattened portions FL1 constitute the top surfaces of the respective base segments BS. The inner wall surfaces of the first grooves GR1 constitute the side surfaces of the base segments BS. Each base segment BS thus has inclined side surfaces and has, for example, a substantially trapezoidal shape in cross section.

As described above, the stress and strain generated in the base layer BL varies with a change in the crystallinity of the variable doped layer VDL, a change in the lattice constant, etc. The shapes and sizes of the grooves GR1 and the base segments BS of the base layer BL also vary accordingly. The smaller the strass and strain generated in the base layer BL is, the greater the sizes of the base segments BS tend to be.

A quantum well layer WA is formed on the base layer BL. The quantum well layer WA is a layer formed from, for example, InGaN. The quantum well layer WA is formed to follow (maintain) the shape of the first grooves GR1 at the surface, and has grooves having the same mesh shape as that of the first grooves GR1. In other words, the quantum well layer WA has an uneven shape corresponding to the grooves GR1 at the interface (bottom surface) with the base layer BL and at the top surface. The quantum well layer WA is formed as a so-called strained quantum well layer.

A barrier layer BA is formed on the quantum well layer WA. The barrier layer BA is a layer formed from, for example, an undoped AlN layer. Like the quantum well layer WA, the barrier layer BA is formed to follow (maintain) the shape of the first grooves GR1 at the surface, and has grooves having the same mesh shape as that of the first grooves GR1. Both of its main surfaces are formed as flattened surfaces. Specifically, the barrier layer BA is formed on the first flat surfaces FS1 of the quantum well layer WA. The top surface of the barrier layer BA is formed as flat surfaces (hereinafter, referred to as second flat surfaces) FL2.

The quantum well layer WA is preferably an undoped layer. In such a case, the semiconductor structure layer SS has a structure in which the n-type semiconductor layer 12, the p-type variable doped layer VDL, the p-type base layer BL, the undoped quantum well layer WA, the barrier layer BA, and the p-type semiconductor layer 15 are laminated in this order.

Specifically, as illustrated in FIG. 1A, the quantum well layer WA and the barrier layer BA are formed on the base layer BL so that the segment shapes of the base segments BS remain. The quantum well layer WA and the barrier layer BA thus have grooves in the positions corresponding to the respective groove portions of the first grooves GR1 of the base layer BL. In other words, the grooves formed in the barrier layer BA which is the layer closest to the p-type semiconductor layer 15 are the second grooves GR2.

The surface of the light-emitting functional layer 13, i.e., the surface of the barrier layer BA other than the second grooves GR2 is formed as flattened portions (hereinafter, referred to as second flattened portions) FL2. The second flattened portions FL2 are formed in the positions and shapes corresponding to the respective first flattened portions FL1.

In other words, the light-emitting functional layer 13 includes the second flattened portions FL2 and the second grooves GR2 at the surface. The second grooves GR2 are formed to define the light-emitting functional layer 13 into a plurality of island-like light-emitting segments ES.

The light-emitting segments ES are formed to correspond to the respective base segments BS. More specifically, the light-emitting segments ES are formed by defining the surface of the light-emitting functional layer 13 in a random net shape. The light-emitting segments ES have random variations or distributions in size and shape, and are arranged (juxtaposed) at random on the surface of the first light-emitting functional layer 13.

The foregoing base layer BL plays the role of a barrier layer with respect to the quantum well layer WA. The base layer BL, the quantum well layer WA, and the barrier layer BA constitute a quantum well light-emitting layer QW. The quantum well layer WA and the barrier layer BA form a quantum well structure layer.

The electron blocking layer 14 formed on the barrier layer BA of the light-emitting functional layer 13 is formed to bury the second grooves GR2. More specifically, the interface (bottom surface) of the electron blocking layer 14 with the barrier layer BA has an uneven shape corresponding to the grooves GR2. The electron blocking layer 14 has a flattened surface at the top.

Now, the occurrence of strain, the formation of the base segments BS, and a change in the emission wavelength of light emitted from the quantum well layer WA according to the sizes of the base segments will be described along with a procedure for forming the light-emitting functional layer 13. The base segments BS formed by the strain resulting from the base layer BL can be formed by growing the base layer BL on the variable doped layer VDL, which is a GaN layer, at a relatively low growth temperature.

Initially, the base layer BL having a crystal composition different from those of the n-type semiconductor layer 12 and the variable doped layer VDL is grown on the variable doped layer VDL, so that stress (strain) is generated in the base layer BL. For example, if an AlN layer serving as the base layer BL is grown on a GaN layer serving as the n-type semiconductor layer 12, tensile strain is generated in the AlN layer due to a lattice mismatch with the GaN layer. Tensile stress is thus generated in the AlN layer during growth. This produces grooves in the AlN layer at the start of growth or during growth of the AlN layer. The AlN layer then grows in a three-dimensional manner. That is, the AlN layer grows in a stereoscopic manner to form a plurality of fine projections and recesses. The start points of formation of such grooves become the bottom portions BP of the grooves GR1.

Moreover, if the AlN layer is grown on the GaN layer at a low temperature, the growth of the AlN layer in a three-dimensional manner is promoted. A large number of grooves are then formed in the surface of the ANl layer in connection with each other (grooves GR1), whereby the AlN layer is defined into a plurality of segments. In such a manner, the base layer BL including the base segments BS can be formed. In this embodiment, the AlN layer serving as the base layer BL was formed at a growth temperature of 780° C.

If an InGaN layer serving as the quantum well layer WA is formed on the base layer BL, the quantum well layer WA is formed as a strained quantum well layer under compressive strain as described above. This also produces a distribution of In content in the quantum well layer WA. More specifically, for example, the regions on the flattened portions FL1 and the regions on the grooves GR1 of the quantum well layer WA are formed to have different In compositions. The quantum well layer WA also has different layer thicknesses at the top surfaces and the side surfaces of the base segments BS. The band gap inside the quantum well layer WA is therefore not constant within the layer, and light of various colors is emitted from the light-emitting functional layer 13 including the fine island-like projections and recesses.

The InGaN layer serving as the quantum well layer WA takes in In more easily when under compressive strain. This seems to reduce the band gap in the InGaN layer, i.e., energy between quantum levels. The quantum well layer WA formed from the InGaN layer under compressive strain therefore emits light of longer wavelengths than InGaN under no compressive strain does.

The higher the compressive strain acting on the InGaN layer, or equivalently, the smaller the sizes of the base segments BS, the greater the intake amount of In, or equivalently, the greater the In compositions. Conversely, the lower the compressive strain, or equivalently, the larger the sizes of the base segments BS, the smaller the intake amount of In, or equivalently, the smaller the In compositions.

The doping amount of the variable doped layer VDL with the Mg dopant can therefore be adjusted to adjust the compressive strain acting on the quantum well layer WA and control the emission wavelengths of the light emitted from the quantum well layer WA.

In the semiconductor light-emitting element 10 according to the present invention, the quantum well layer WA is formed on the base layer BL having the grooves GR1 under compressive strain. As descried above, the In content in the quantum well layer WA is thereby made nonuniform within the layer, and the thickness of the quantum well layer WA is made nonuniform within the layer. Since the band gap of the quantum well layer WA becomes nonuniform within the layer, wide-wavelength band light having high color rendering properties can be obtained.

As described above, the greater the Mg doping amount of the variable doped layer VDL, the lower the compressive strain generated in the base layer BL. As described above, the lower the compressive strain, the smaller the amount of In taken into the quantum well layer WA and the greater the band gap in the InGaN layer.

According to the semiconductor light-emitting element 10 of the present invention, the Mg doping amount of the variable doped layer VDL can therefore be increased to shift the wavelengths of the light emitted from the quantum well layer WA to shorter wavelengths. Conversely, the Mg doping amount of the variable doped layer VDL can be reduced to shift the wavelengths of the light emitted from the quantum well layer WA to longer wavelengths. In other words, the Mg doping amount of the variable doped layer VDL can be adjusted to adjust the emission wavelengths of the light-emitting element 10.

If the Mg doping amount of the variable doped layer VDL was set to $2 \times 10^{19}$ atoms/cm$^3$, light in a wavelength region of 460 to 580 nm with a peak near 500 nm was emitted from the light-emitting functional layer 13. If the Mg doping amount of the variable doped layer VDL was experimentally set to 0, light in a wavelength region of 510 to 650 nm with a peak near 570 nm was emitted.

As described above, in the present embodiment, the variable doped layer VDL doped with Mg is formed, and the base layer BL is formed on the variable doped layer VDL. The inventors of the present invention have found that a light-emitting element having high reproducibility about emission light can be formed by thus forming the variable doped layer VDL between the n-type semiconductor layer 12 and the base layer BL and controlling the Mg doping amount of the variable doped layer VDL.

[First Modified Example]

Figure 2:
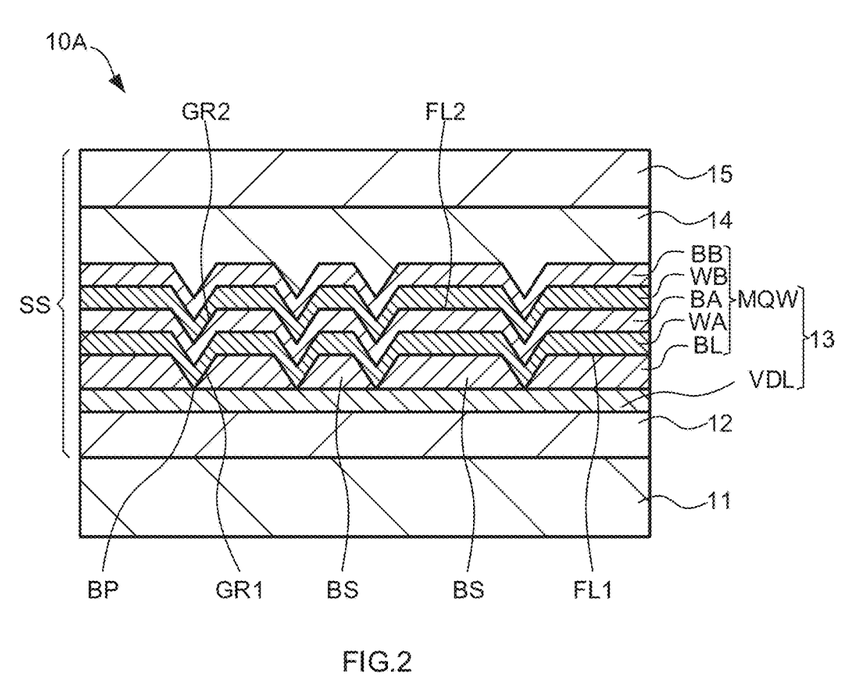
FIG. 2 is a cross-sectional view illustrating a structure of a semiconductor light-emitting element according to a modified example of the first embodiment.

FIG. 2 is a cross-sectional view illustrating a structure of a semiconductor light-emitting element 10A according to a first modified example of the first embodiment. The light-emitting element 10A has the same configuration as that of the light-emitting element 10 except the configuration of the light-emitting functional layer 13. The light-emitting functional layer 13 has a structure in which a plurality (in the present modified example, two) of quantum well layers are laminated. More specifically, the light-emitting functional layer 13 includes a base layer BL, a quantum well layer WA, and a barrier layer BA, and has a structure in which a quantum well layer WB and a barrier layer BB are further laminated on the barrier layer BA. As employed herein, the barrier layers BA and BB are undoped.

The light-emitting functional layer 13 may thus have a multiple quantum well structure including two or more quantum well layers. In such a case, the quantum well structure (WA and BA) on the base layer BL side and the other quantum well structure (WB and BB) formed thereon differ in composition (In content) and the nonuniformity of an in-plane distribution of total thickness. In the present modified example with a plurality of quantum well structures (MQW), the nonuniformity of the band gap (energy between quantum levels) increases to provide light emission with a spectral width wider than with a single quantum well (first embodiment).

Second Embodiment

Figure 3:
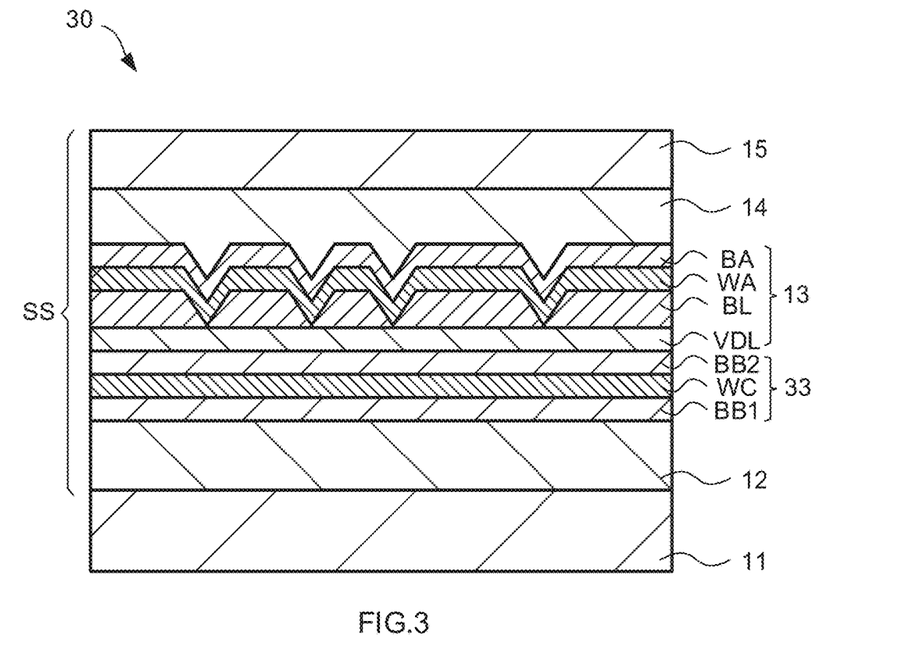
FIG. 3 is a cross-sectional view illustrating a structure of a semiconductor light-emitting element according to a second embodiment.

FIG. 3 is a cross-sectional view illustrating a structure of a semiconductor light-emitting element 30 according to a second embodiment. The light-emitting element 30 has the same configuration as that of the semiconductor light-emitting element 10 except that a light-emitting functional layer 33 serving as a second light-emitting functional layer is added. The light-emitting functional layer 33 serving as the second light-emitting functional layer is formed between the n-type semiconductor layer 12 and the light-emitting functional layer 13 serving as the first light-emitting functional layer of the light-emitting element 10. The light-emitting functional layer 33 is formed to have a center emission wavelength and a band gap different from those of the light-emitting functional layer 13.

In this embodiment, the light-emitting functional layer 33 has a structure in which a uniformly flat quantum well layer WC is sandwiched between two barrier layers BB1 and BB2 on the n-type semiconductor layer 12. The light-emitting functional layer 13 (variable doped layer VDL) is formed on the barrier layer BB2 lying closest to the p-type semiconductor layer 15. For example, the quantum well layer WC has the same configuration as that of the quantum well layer WA, for example, an InGaN composition. The barrier layers BB1 and BB2 each have the same configuration as that of the n-type semiconductor layer 12, for example, a GaN composition.

In this embodiment, the light-emitting functional layer 33 having a quantum well structure is added to the n-type semiconductor layer 12 side of the light-emitting functional layer 13 in the light-emitting element 10 of the first embodiment. The light-emitting functional layer 33 is formed on the flat surface of the n-type semiconductor layer 12, and emits light having a wavelength shorter than those of the light emitted from the light-emitting functional layer 13, for example, blue light having a wavelength of around 450 nm.

According to the semiconductor light-emitting element 30 of the present embodiment, light having an emission wavelength peak in a pure blue region can thus be additionally emitted, compared to the first embodiment. The configuration of the present embodiment is advantageous if, for example, the intensity of light of the blue region from the semiconductor light-emitting element is desired to be increased.

The base layer BL is not directly formed on the barrier layer BB2 but on the variable doped layer VDL doped with Mg serving as a p-type dopant. As described above, the emission wavelengths of the light-emitting functional layer 13 can thereby be controlled and the reproducibility of the emission wavelengths can be improved.

The formation of the variable doped layer VDL on the barrier layer BB2 improves the efficiency of hole injection into the light-emitting functional layer 33, compared to the case where the base layer BL is directly formed on the barrier layer BB2. The emission light from the light-emitting functional layer 33 can thus be increased.

The barrier layer BB2 may be omitted in the semiconductor light-emitting element 30 of the second embodiment. In such a case, the variable doped layer VDL functions as a barrier layer, and blue light is emitted from the light-emitting functional layer 33.

Figure 4:
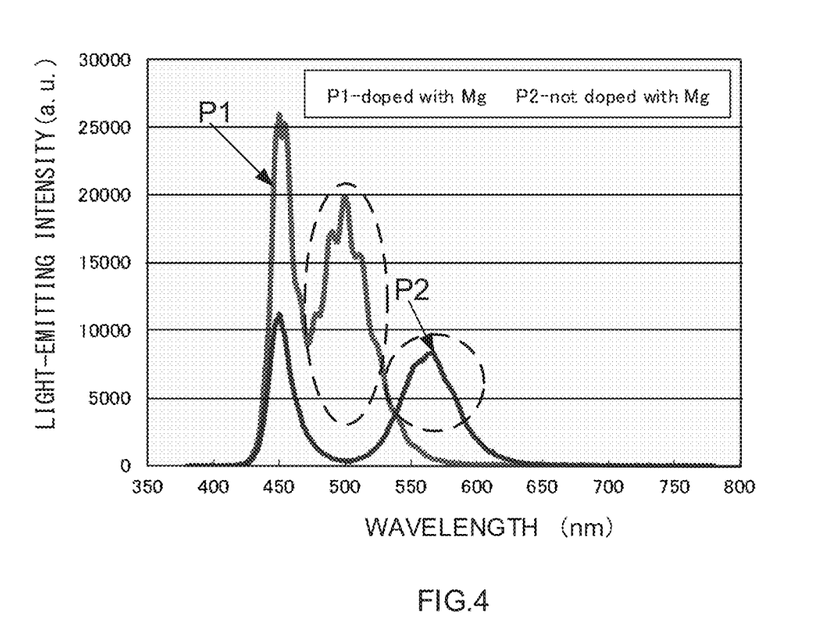
FIG. 4 is a chart showing a light emission spectrum of the semiconductor light-emitting element according to the second embodiment.

FIG. 4 shows an emission wavelength spectrum (in the chart, P1) when the Mg doping amount of the variable doped layer VDL in the semiconductor light-emitting element 30 of the second embodiment is $2e^{19}$ atoms/cm$^3$, and a wavelength spectrum (in the chart, P2) when the variable doped layer VDL is undoped. Areas surrounded by broken lines in FIG. 4 show the wavelength spectra of light emitted from the light-emitting functional layer 13.

As illustrated in FIG. 4, the wavelength spectrum of the light emitted from the light-emitting functional layer 13 includes shorter wavelengths when the variable doped layer is doped with Mg than when the variable doped layer VDL is undoped. Doping the variable doped layer VDL with Mg can thus shift the peak of the emission wavelength to shorter wavelengths.

Third Embodiment

Figure 5:
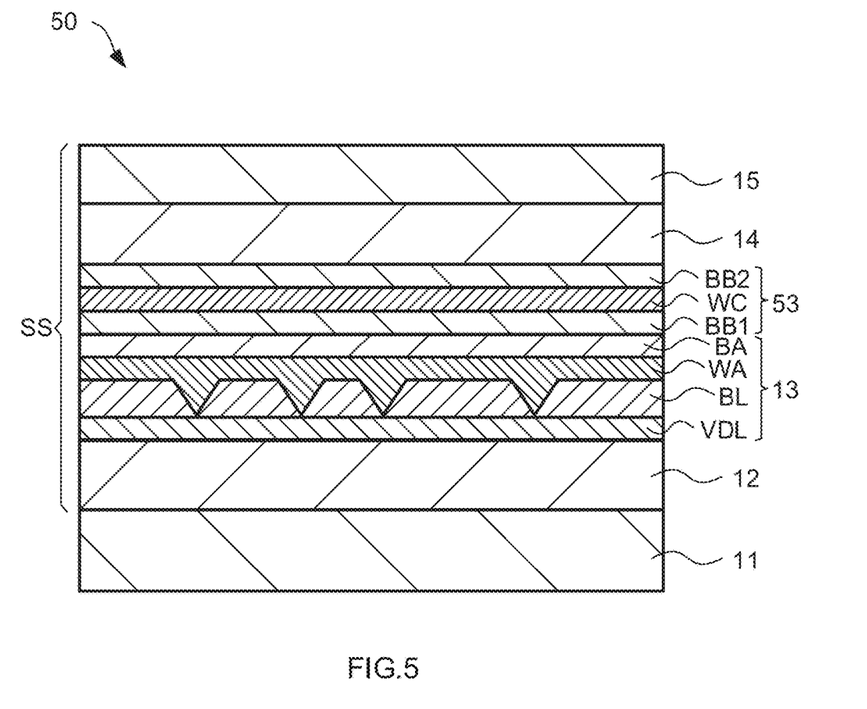
FIG. 5 is a cross-sectional view illustrating a structure of a semiconductor light-emitting element according to a third embodiment.

FIG. 5 is a cross-sectional view illustrating a structure of a semiconductor light-emitting element 50 according to a third embodiment. The light-emitting element 50 includes a light-emitting functional layer 53 similar to the light-emitting functional layer 33 according to the second embodiment. The light-emitting functional layer 53 is formed on the p-type semiconductor layer 15 side of the light-emitting functional layer 13.

In the light-emitting element 50, the light-emitting functional layer 53 is formed on a layer having a flat surface so that blue light is emitted from the light-emitting functional layer 53. As shown in the diagram, the quantum well layer WA of the light-emitting functional layer 13 is formed to bury the grooves GR1 so that the quantum well layer WA has a flat surface.

The light-emitting functional layer 53 has a structure in which a uniformly flat quantum well layer WC is sandwiched between two barrier layers BB1 and BB2 on the barrier layer BA. For example, the quantum well layer WC has the same configuration as that of the quantum well layer WA, for example, an InGaN composition. The barrier layers BB1 and BB2 each have the same configuration as that of the n-type semiconductor layer 12, for example, a GaN composition.

In this embodiment, the light-emitting functional layer 53 having a quantum well structure is configured to be added to the p-type semiconductor layer 15 side of the light-emitting functional layer 13 in the light-emitting element 10 of the first embodiment. The light-emitting functional layer 33 is formed on the flat surface of the barrier layer BA, and emits light having a wavelength shorter than those of the light emitted from the light-emitting functional layer 13, for example, blue light having a wavelength of around 450 nm.

According to the semiconductor light-emitting element 50 of the present embodiment, light having an emission wavelength peak in the pure blue region can thus be additionally emitted, compared to the first embodiment. The configuration of the present embodiment is advantageous if, for example, the intensity of light of the blue region from the semiconductor light-emitting element is desired to be increased. More than one light-emitting functional layer 13 may be included. In such a configuration, another base layer, quantum well layer, and barrier layer may be further laminated in such order on the barrier layer BA.

A semiconductor light-emitting element may be configured to include both the light-emitting functional layer 33 of the second embodiment and the light-emitting functional layer 53 of the third embodiment. More specifically, the light-emitting functional layer 13 may be configured to be sandwiched between the light-emitting functional layers 33 and 53.

In the foregoing embodiments, the first conductivity type is described to be an n-type conductivity type, and the second conductivity type is described to be a p-type which is the conductivity type opposite to the n-type. However, the first conductivity type may be a p-type and the second conductivity type may be an n-type.

In the foregoing embodiments, the light-emitting element 10 is described to include a structure in which the semiconductor structure layer SS is formed on the growth substrate serving as the mounting substrate 11. However, the mounting substrate 11 is not limited to a growth substrate. For example, the semiconductor light-emitting elements 10, 10A, 30, and 50 may have a structure such that after the semiconductor structure layer SS is grown on a growth substrate, the semiconductor structure layer SS is bonded to another substrate (support substrate) and the growth substrate is removed. In such a case, the other substrate bonded is bonded onto the p-type semiconductor layer 15. The substrate to be bonded may be made of material having a high heat dissipation property, such as Si, AlN, Mo, W, and CuW.

In the foregoing embodiments, the base layer BL is doped with Mg. However, the base layer BL does not necessarily need to be doped with Mg and may be an undoped layer. The dopant for the base layer BL to be doped with is not limited to Mg and may be other p-type dopants.

The foregoing embodiments have been described by using an example in which the base layer BL is a layer formed from AlN. However, the base layer BL may be a layer formed from AlGaN.

The foregoing embodiments have been described by using an example in which the variable doped layer VDL is a layer formed from GaN doped with Mg. However, this is not restrictive. For example, the variable doped layer VDL may be a layer of other GaN materials, such as AlInGaN, doped with a p-type dopant.

Although not illustrated in the diagrams, a buffer layer (underlayer) may be arranged between the mounting substrate 11 and the n-type semiconductor layer 12 for the purpose of relaxing strain that can occur in the interface between the growth substrate and the semiconductor structure layer SS and in the interface between the respective layers in the semiconductor structure layer SS.

Various numerical values, dimensions, materials, and the like in the foregoing embodiments are just examples, and may be appropriately selected according to intended uses and light-emitting elements to be manufactured.

REFERENCE SIGNS LIST 10, 10A, 30, 50 semiconductor light-emitting element
12 n-type semiconductor layer (first semiconductor layer)
13, 33, 53 light-emitting functional layer
14 electron blocking layer
15 p-type semiconductor layer (second semiconductor layer)
BL base layer
BS base segment
GR1, GR2 groove
WA, WB, WC quantum well layer
VDL variable doped layer

The invention claimed is:

1. A semiconductor light-emitting element comprising:
a first semiconductor layer of a first conductivity type;
a light-emitting functional layer formed on said first semiconductor layer; and
a second semiconductor layer that is formed on said light-emitting functional layer and is of a second conductivity type opposite to that of said first semiconductor layer, wherein
said light-emitting functional layer includes:
a doped layer that is formed on said first semiconductor layer and doped with a dopant of said second conductivity type,
a base layer formed on said doped layer, said base layer having such a composition that causes stress and strain in said base layer from said doped layer, said base layer including a plurality of base segments formed in a random net shape, and
a quantum well structure layer formed on said base layer.

2. The semiconductor light-emitting element according to claim 1, wherein said quantum well structure layer is an undoped layer.

3. The semiconductor light-emitting element according to claim 1, wherein said dopant of said doped layer is Mg.

4. The semiconductor light-emitting element according to claim 1, wherein:
- said first semiconductor layer and said doped layer include a GaN composition;
- said quantum well structure layer includes a quantum well layer and a barrier layer that are formed on said base layer;
- said base layer and said barrier layer include an AlN or AlGaN composition; and
- said quantum well layer includes an InGaN composition.

5. The semiconductor light-emitting element according to claim 1, further comprising a second light-emitting functional layer between said doped layer and said first semiconductor layer, said second light-emitting functional layer including a uniformly flat quantum well structure.

6. The semiconductor light-emitting element according to claim 5, wherein said second light-emitting functional layer has a center emission wavelength different from that of said quantum well layer.

* * * * *